United States Patent
Lockman et al.

(10) Patent No.: US 8,122,397 B2
(45) Date of Patent: Feb. 21, 2012

(54) METHOD AND SYSTEM FOR MAPPING SOURCE ELEMENTS TO DESTINATION ELEMENTS AS INTERCONNECT ROUTING ASSIGNMENTS

(75) Inventors: Tyler J. Lockman, Embrun (CA); Phuong Ha-Uyen Landry, Ottawa (CA)

(73) Assignee: Cadence Design Systems, Inc., San Jose, CA (US)

(*) Notice: Subject to any disclaimer, the term of this patent is extended or adjusted under 35 U.S.C. 154(b) by 558 days.

(21) Appl. No.: 12/331,218

(22) Filed: Dec. 9, 2008

(65) Prior Publication Data
US 2009/0089722 A1 Apr. 2, 2009

Related U.S. Application Data

(62) Division of application No. 11/239,970, filed on Sep. 30, 2005, now Pat. No. 7,464,348.

(51) Int. Cl.
*G06F 17/50* (2006.01)
(52) U.S. Cl. ........ 716/100; 716/104; 716/110; 716/119; 716/126; 716/132
(58) Field of Classification Search .......... 716/100–107, 716/110–111, 118–119, 126, 132
See application file for complete search history.

(56) References Cited

U.S. PATENT DOCUMENTS

| | | | |
|---|---|---|---|
| 5,237,514 A | 8/1993 | Curtin | |
| 5,308,798 A * | 5/1994 | Brasen et al. | 438/129 |
| 5,559,997 A | 9/1996 | Tsuchida et al. | |
| 6,209,123 B1 | 3/2001 | Maziasz et al. | |
| 6,256,769 B1 | 7/2001 | Tamarkin et al. | |
| 6,691,296 B1 | 2/2004 | Nakayama et al. | |
| 6,823,500 B1 * | 11/2004 | Ganesh et al. | 716/115 |
| 6,880,145 B1 | 4/2005 | Wright et al. | |
| 2003/0237066 A1 | 12/2003 | Ito | |
| 2004/0111687 A1 * | 6/2004 | Dhanwada et al. | 716/8 |

OTHER PUBLICATIONS

Non-Final Office Action dated Feb. 26, 2008 for U.S. Appl. No. 11/239,970.
Notice of Allowance dated Oct. 14, 2008 for U.S. Appl. No. 11/239,970.

* cited by examiner

*Primary Examiner* — Paul Dinh
(74) *Attorney, Agent, or Firm* — Vista IP Law Group, LLP

(57) ABSTRACT

Aspects for optimized mapping of source elements to destination elements as interconnect routing assignments are described. The aspects include utilizing chosen rules to establish a priority for mapping, and generating mapping assignments based on the priority. The mapping assignments are recursively refined to converge on an optimized solution.

18 Claims, 4 Drawing Sheets

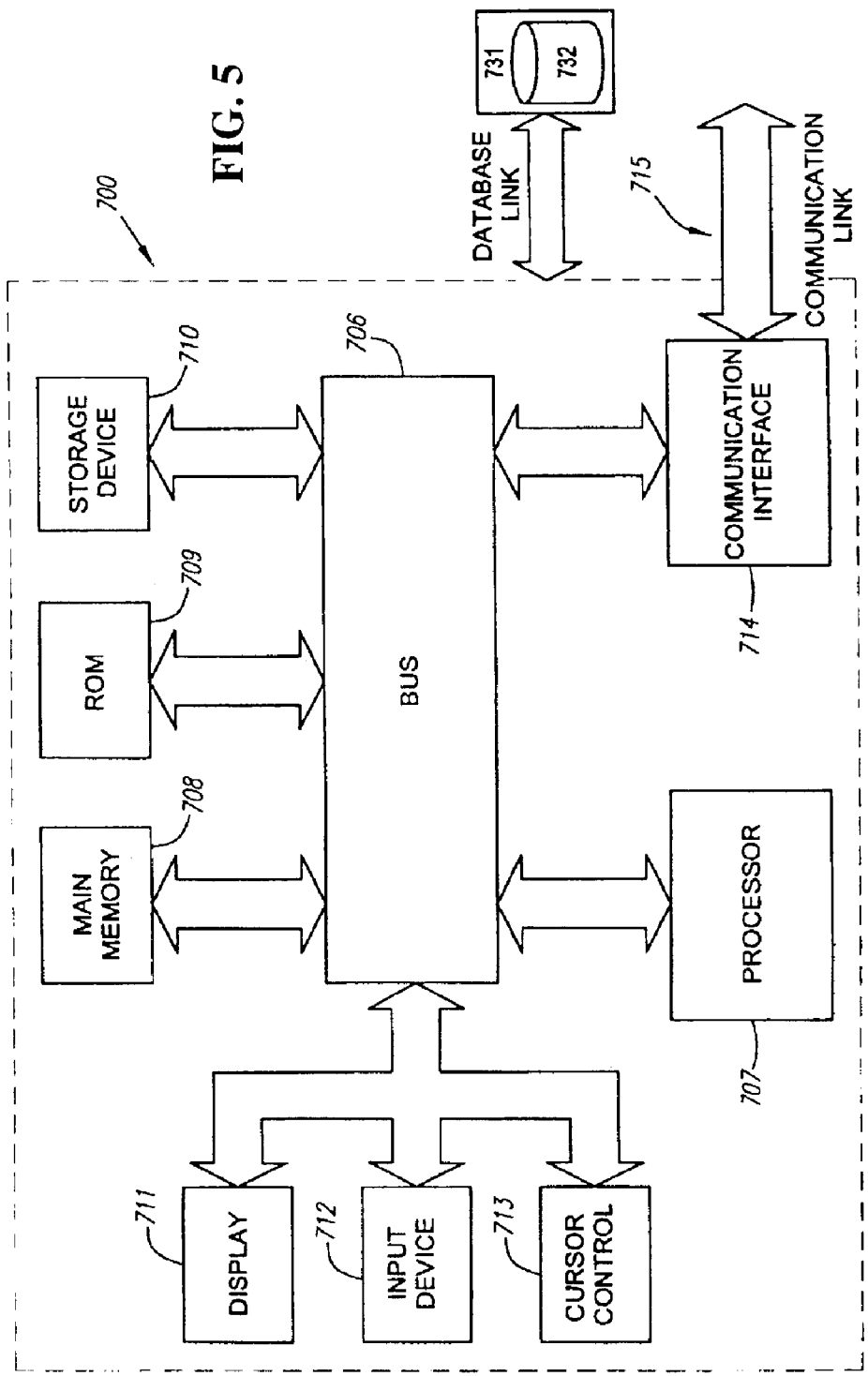

METHOD AND SYSTEM FOR MAPPING SOURCE ELEMENTS TO DESTINATION ELEMENTS AS INTERCONNECT ROUTING ASSIGNMENTS

CROSS-REFERENCE TO RELATED APPLICATIONS

The present application is a divisional of U.S. application Ser. No. 11/239,970, filed on Sep. 30, 2005, now issued at U.S. Pat. No. 7,464,348, which is hereby incorporated by reference in its entirety.

FIELD OF THE INVENTION

The present invention relates to interconnect routing, and more particularly to performing net assignment in IC package design by optimized mapping of source elements to destination elements.

BACKGROUND OF THE INVENTION

As designers strive to improve the capabilities of new integrated circuits (ICs), developments in IC design have dramatically increased the power, speed, and capability of the IC. As the power, speed, and capability of ICs increase, the number of input/output (I/O) terminals that each IC is interconnected with has also increased.

Normally, ICs are placed inside a "package" before they can be installed on a Printed Circuit Board (PCB). As is generally known, IC Package Interconnect is the process of designing the electrically conductive traces between the terminals on the IC die and the pins on the package. Using Electronic Design Automatic (EDA) tools, the human designer takes logical net data from the IC die and physical footprint data from the package. The designer uses this data to plan and design the electrical traces within the package to connect the IC die to the package pins. Once these connections are made, a connection is made from the package pins to the PCB.

Until recently, most packages had only a few dozen or a few hundred pins. The routing required to connect IC to package was not particularly difficult or time consuming. Modern Ball Grid Array (BGA) packages now routinely have hundreds or thousands of pins. Some have over ten thousand die pins. As well, higher speed signals impose more strict constraints on the actual connections used and their relation to each other. A task that previously took a few hours can now take days or even weeks. Thus, automated solutions have been sought.

Almost all package auto-routers are based on the assumption that they are trying to create a path, for each net, between a start point and an end point. A net is typically defined as a collection of pins that need to be electrically connected. A list of all or some of the nets in a layout is referred to as a net list. If both of the start and end points of a path are not already established, then the auto-router cannot be used. Thus, before invoking a router, the user must establish a mapping of these source/destination pairings, which leads to significant problems.

In a high pin count package, the establishment of source-destination pin pairings could involve establishing mappings between thousands of pins, with routing happening on dozens of substrate layers. This leads to a massive jumble of connection path marker lines (flight lines) which is very difficult for a user to understand and change. Additionally, there are multiple interacting physical, electrical, and signal integrity rules which must all be satisfied for a chosen solution to be usable.

In a design with n die pins and m package pins, the solution space is $O(n*m)$. Within the solution space, there may be only a single assignment solution which will satisfy all constraints on the system.

One previous approach to providing a solution involves a process of mapping pins to achieve a pattern which minimizes the crossing of flight lines, while also averaging the length of the net assignments across the entire selection set. An alternate approach utilizes the mapping of pins by first breaking each of the source and destination sets into a set of pins for each available routing layer. Each layer's set of pins is then assigned separately based on a division of the pins into quadrants, e.g., north, south, east, and west. Each side is sorted individually, with the pins being mapped, in order, from the middle of the side out to the edges, regardless of crossing flight lines.

The prior approaches share many of the same disadvantages. Their performance is based on an assumption of a clean design, without consideration of assignments to pins beyond that assumption. In addition, both solutions consider only very limited physical rules in the form of crossed flight lines, flight line length, and relative pin locations. They do not consider any route line spacing rules, electrical constraints, or signal integrity issues. Further, neither approach considers the hierarchical ordering of nets and neither is able to perform when there are multiple die components in the package, since each solution is designed for use in single-chip, radially-routed packages. Further, neither is able to handle power and ground nets, which have many pins and can be routed in many different patterns. Under all of these limitations, assignment of all source pins to destination pins may occur, but the assignment may not be routable and may require significant manual refinement.

Accordingly, what is needed is an interconnect routing solution capable of performing net assignment in IC package designs that optimizes source and destination element mappings. The present invention addresses such a need.

BRIEF SUMMARY OF THE INVENTION

Aspects for optimized mapping of source elements to destination elements as interconnect routing assignments are described. The aspects include utilizing chosen rules to establish a priority for mapping, and generating mapping assignments based on the priority. The mapping assignments are recursively refined to converge on an optimized solution.

Through the aspects of the present invention, an effective and efficient manner of performing net assignment is achieved. The utilization of recursive refinement of predicted routing provides an optimization approach that seeks to improve and ultimately converge on the ideal solution. These and other advantages of the present invention will be more fully understood in conjunction with the following detailed description and accompanying drawings.

BRIEF DESCRIPTION OF SEVERAL VIEWS OF THE DRAWINGS

FIG. 5 illustrates a block diagram of a system for performing the method of FIG. 2 in accordance with the present invention.

DETAILED DESCRIPTION OF THE INVENTION

The present invention relates to performing net assignment in an IC package design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
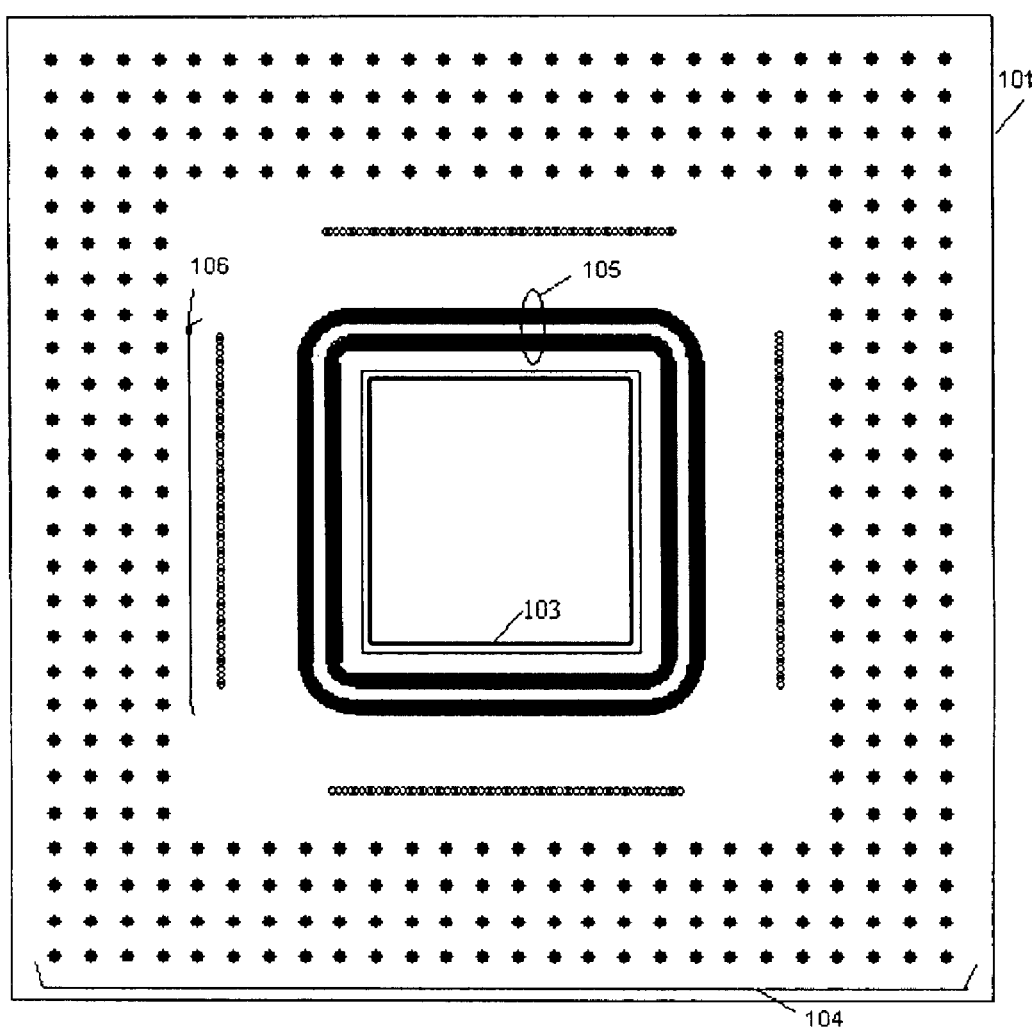
FIG. 1 illustrates an example of an IC package before it has been routed.

FIG. 1 shows an example of an IC Package 101 before it has been routed. An IC component is placed in the center of the package and is ringed by IC package ball pads 104. The example of an IC package 101 shown in FIG. 1 has 4 rings of IC package ball pads 104 around the outside edge. The solid rings 105 are called "power and ground rings." FIG. 1 also illustrates four arcs composed of small oblong pads, called bond fingers 106. The IC component has its I/O terminals routed to the each of the IC component die pins 103. These pins 103 act as terminals for the IC and are in turn electrically connected to various bond pads 106 and power/ground rings 105. Some pins 103 may be electrically connected to the same bond pad 106 and some pads 103 may be connected to multiple bond pads 106.

Figure 2:
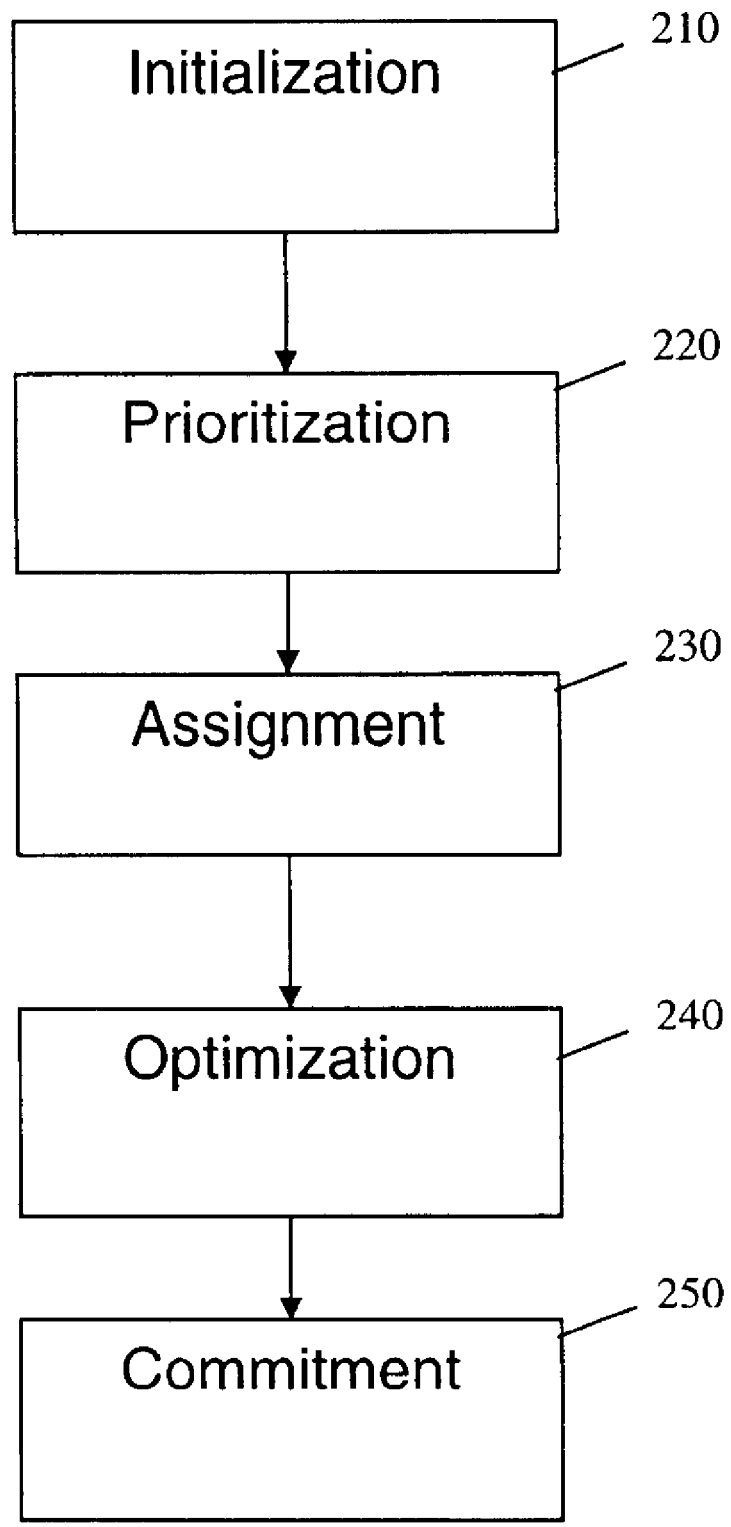
FIG. 2 illustrates a block flow diagram for a method of assigning nets in accordance with the present invention.

FIG. 2 illustrates a block diagram of an overall flow chart for a method of assigning nets to determine an interconnect routing solution, such as for routing nets in an IC package 101 (FIG. 1), in accordance with the present invention. A system capable of performing the method is presented below with reference to FIG. 5. As shown in FIG. 2, the assigning begins with an initialization of data and a topological map (act 210), such as from a host design database.

The data initialization includes the loading of a cost/strategy file that presents rules and cost parameters, as custom configured/chosen by a user. The cost/strategy file indicates a base assignment strategy selected by a user that is to be followed during the net mapping. For example, a user selects a preferred assignment of differential pairs in tandem or broad-side orientation, the degree to which an optimal solution is sought (to coincide with law of diminishing returns), and whether to completely fill each available routing layer before moving to the next (minimize layers and cost) or whether to balance the routing across all layers (optimize for yield). User-defined rules may also be defined (with a method for computing pass/fail of the rule) and referenced in the cost/strategy file. The selection of a base router strategy includes the ability to indicate a relative weight of importance to individual rules. By way of example, it may be more important for nets of a differential pair to be within their relative delay tolerance than within their individual minimum delays, as is well appreciated by those skilled in the art.

The initialization of a topological map involves construction of the map based on the entire design by automatically identifying topological organization of a design layout. The map allows accurate modeling of the implications of decisions on selected items, as well as the design as a whole. It is used for doing layer and channel analysis. With the topological map, the parent database information is converted into a comprehensive, specially organized structure from which necessary information can be efficiently extracted. It is optimized for the operations of extraction of a routing path (channels/layers) for a given net, analysis of channel and layer capacity and usage information, obstacle detection and avoidance, and fan-out analysis with route start/end point determination.

Figure 3:
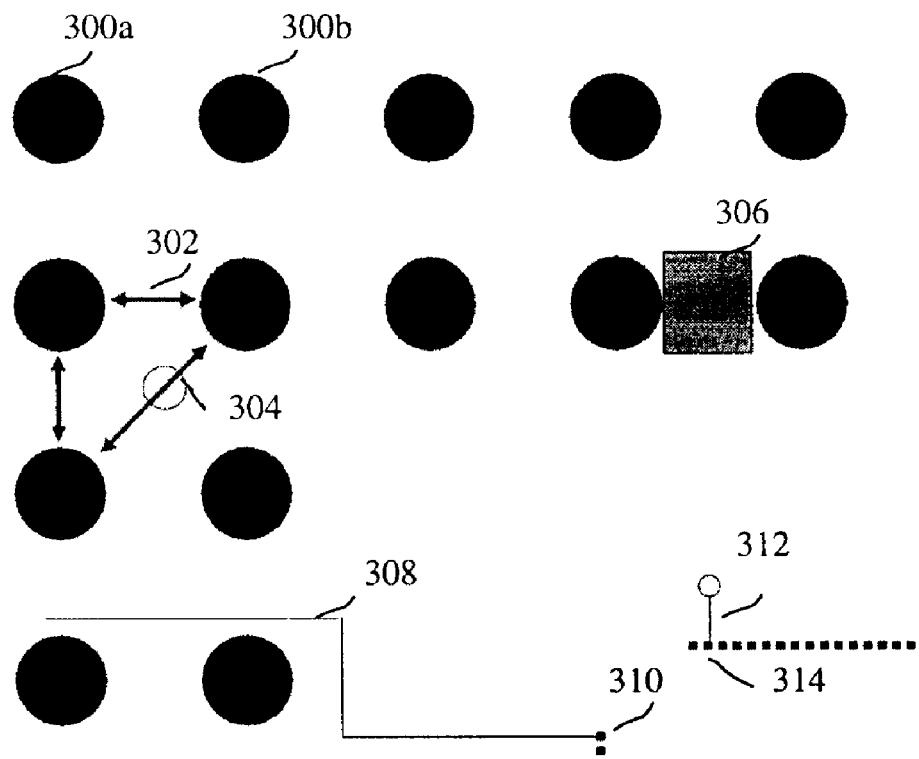
FIG. 3 illustrates an example of a topological map in accordance with the present invention.

By way of example, FIG. 3 illustrates a simple visual depiction of an example topological map that includes package (e.g., BGA) ball pads 300a, 300b, etc., having channels 302 in between. Some channels include vias 304 or may be blocked 306. Routing channel consumption is indicated by line 308 for routing to a die pin 310. The map may also include pre-existing assignment indicators 312 traced to die pin 314.

Referring again to FIG. 2, once the initialization is completed, the process continues with prioritization (act 220). Prioritization involves the forming of a list of source pins/nets as an ordered list based on the pin types, associations between the selected nets, and the base strategy identified in the cost/strategy file. This prioritization determines the order of net assignment, as well as an identification of which other net(s) a specific net is allowed to "push" out of a current assignment to generate a better global solution. For each pin/net, the number and types of the applied rules becomes a factor to determine overall priority. Thus, for example, a net with 4 rules defined on it has a higher priority than a net with only 2 defined rules (assuming equally-weighted rules), while a differential pair is of higher priority than a traditional signal net.

Following prioritization, net assignment occurs (act 230). In this phase, an initial set of assignments is generated from the source to destination pins. The initial assignment attempts to assign all pins from the source set to some set of pins in the destination set, starting from the lowest priority net and working up to the highest priority. Thus, all nets are walked in prioritized order, starting from the lowest-priority net, with an attempt to calculate the ideal destination pin for each source pin on each net. If the desired destination pin is already occupied by a previous assignment, then, recursively, an adjustment is made to lower-priority net(s), in order to provide a more ideal solution given this new information. By working from the lowest to the highest priority net, each pin, at least initially, gets the assignment that is ideal for it and is then only changed if a higher priority net needs that destination pin to achieve a more desirable overall solution.

Once all assignments are made, optimization of the assignment proceeds (act 240). The optimization of the assignment pattern occurs by injecting an element of randomness within the assignment process to scan for better solutions. This includes selecting a pin from the source set at random. The selected pin is then assigned to its ideal destination (if not already there), and the required recursive reassignments are computed. This reassignment solution is then compared with the original assignment, and, if this reassignment solution has a lower total cost, it is stored as the new best assignment solution. Optimization continues in this manner with each new best assignment solution until no new best assignment solution is found.

In performing the assignment and optimization of the assignment, routines are invoked to aid in achieving adaptability, user-customization, and reusability. One routine determines a set of potential destinations for a given source pin/net (e.g., "WhereCanIGo"). This routine computes, from the set of all available destination pins, which destination pins have the potential to satisfy specified assignment constraints (e.g., from the cost/strategy file). Pins are classified by their applicability to specified assignment constraints.

Figure 4:
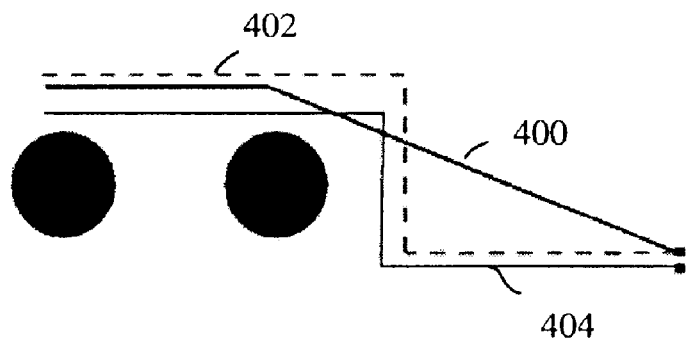
FIG. 4 illustrates an example of path prediction in accordance with the present invention.

Another set of routines determines whether, given certain physical constraints, how (and if) a physical trace can be created which will get from the source to a destination while meeting the physical constraints (e.g., "CanIGetThere/HowDoIGetThere"). In this manner, for a given destination, the channels to be used to get there will be determined. Calculation of the path may be abstracted to include a desired level of detail (e.g., from flight lines to a completed path that can be converted to a finalized route). The available routing layers are scanned to look for a path of channel points which are free and will get from the start to the end points defined. Thus, the determination uses a predictive routing path based on channel capacities and routing obstacles. By way of example, FIG. 4 illustrates a simple path prediction 400 and an accurate path prediction 402 that accounts for the consumed routing channel 404 that would be identified by this set of routines.

A routine is also used for contrasting two assignments to determine which is optimal (e.g., "IsItBetter"). Determination is based on the relative costs associated with each rule (if any) that is broken by each of the two assignment solutions being compared. It is also based on the overall length of the two assignments and the layer assignment criteria (e.g., minimum layers used versus equal distribution across all available layers), such that, if two assignments break an equal number of rules, then ties may be broken using the length and layer information. Thus, given a base assignment and a proposed assignment, scanning of defined rules occurs to determine whether the proposed assignment is, in fact, more optimized than the base assignment. This includes use of the extracted topological map for efficient checking of rules violations in the proposed assignment.

Referring again to FIG. 2, once the iterations of assignment optimization completes, commitment of the solution occurs (act 250). For commitment, the final assignments are annotated back to the main tool's database. This phase is straightforward, as it simply involves taking the computed results and committing them back to the design for the user. Thus, it is strictly a translation of the resulting data, as is well understood in the art.

The aspects of the present invention, as described herein, predict the most likely channels to be used when the package substrate will be routed. As the design process approaches the later stages of design, where more fan-out, routing and obstacle information is available, this information is considered and allows the optimization approach to work even more accurately, replacing earlier predictions and assumptions with facts based on the exact routing paths laid down.

Further, since each net is considered in isolation, then as a member of any associative, hierarchical groups (differential pairs, matched groups, buses, etc), and finally in the context of the design as a whole, the present invention achieves the ability to constantly refine the solution. That is, once an initial assignment is completed, it introduces turbulence into the pattern in an attempt to derive additional optimizations and further improve the pattern to ultimately arrive at the ideal solution.

In addition, the provision of an input file of customized rules and priorities by a user to guide the establishment of an optimized assignment allows there to be a minimal amount of interactive user input. Further, these rules files can be composed into a library of assignment solutions that is tailored to the specific classes of designs. The use of the input file further allows providing a recommended or restricted set of layers which may be used for routing of a given net or set of nets.

The versatility and parameterized elements of the present invention permit equal effectiveness in performing assignments in single/multi-chip packages and in system-in-package designs, as well. Assignments can be performed in either direction—from die pins to package pins or vice versa—with a full assignment on a clean design, or iterative use to refine the assignment as the design reaches various stages of completion. This allows a user the flexibility of manually assigning specific critical nets, while establishing the remaining assignments in an optimal manner through the present invention.

FIG. 5 illustrates a system capable of performing the steps to determine an interconnect routing solution, such as for routing nets in an IC package 101 (FIG. 1), according to various embodiments of the present invention. In an embodiment of the invention, execution of the sequences of instructions required to practice the invention is performed by a single computer system 700. According to other embodiments of the invention, two or more computer systems 700 coupled by a communication link 715 may perform the sequence of instructions required to practice the invention in coordination with one another. In order to avoid needlessly obscuring the invention, a description of only one computer system 700 will be presented below; however, it should be understood that any number of computer systems 700 may be employed to practice the invention. As used herein, the term computer system 700 is broadly used to describe any computer that can store and independently run one or more programs, e.g., a personal computer, a server computer, a portable laptop computer, or a personal data assistants ("PDA").

Each computer system 700 may include a communication interface 714 coupled to the bus 706. The communication interface 714 provides two-way communication between computer systems 700.

A computer system 700 may transmit and receive messages, data, and instructions, including program, i.e., application code, through its respective communication link 715 and communication interface 714. Received program code may be executed by the respective processor(s) 707 as it is received, and/or stored in the storage device 710, or other associated non-volatile media, for later execution.

In an embodiment, the computer system 700 operates in conjunction with a data storage system 731, wherein the data storage system 731 contains a database 732 that is readily accessible by the computer system 700. In alternative embodiments, the database 732 may be stored on another computer system 700, e.g., in a memory chip and/or hard disk. In yet alternative embodiments, the database 732 may be read by the computer system 700 from one or more floppy disks, CD-ROMs, or any other medium from which a computer can read. In an alternative embodiment, the computer system 700 can access two or more databases 732, stored in a variety of mediums, as previously discussed.

A computer system 700 includes a bus 706 or other communication mechanism for communicating instructions, messages and data, collectively, information, and one or more processors 707 coupled with the bus 706 for processing information. A computer system 700 also includes a main memory 708, such as a random access memory (RAM) or other dynamic storage device, coupled to the bus 706 for storing dynamic data and instructions to be executed by the processor(s) 707. The main memory 708 also may be used for storing temporary data, i.e., variables, or other intermediate information during execution of instructions by the processor(s) 707.

A computer system 700 may further include a read only memory (ROM) 709 or other static storage device coupled to the bus 706 for storing static data and instructions for the processor(s) 707. A storage device 710, such as a magnetic disk or optical disk, may also be provided and coupled to the bus 706 for storing data and instructions for the processor(s) 707.

A computer system 700 may be coupled via the bus 706 to a display device 711, such as, but not limited to, a cathode ray tube (CRT), for displaying information to a user. An input device 712, including alphanumeric and other keys, is coupled to the bus 706 for communicating information and command selections to the processor(s) 707. Another type of user input device may include a cursor control 713, such as, but not limited to, a mouse, a trackball, a fingerpad, or cursor direction keys, for communicating direction information and command selections to the processor(s) 707 and for controlling cursor movement on the display 711.

According to one embodiment of the invention, an individual computer system 700 performs specific operations by their respective processor(s) 707 executing one or more sequences of one or more instructions contained in the main memory 708. Such instructions may be read into the main memory 708 from another computer-usable medium, such as the ROM 709 or the storage device 710. Execution of the sequences of instructions contained in the main memory 708 causes the processor(s) 707 to perform the processes described herein. In alternative embodiments, hard-wired circuitry may be used in place of or in combination with software instructions to implement the invention. Thus, embodiments of the invention are not limited to any specific combination of hardware circuitry and/or software.

The present invention has been described in accordance with the embodiments shown, and one of ordinary skill in the art will readily recognize that there could be variations to the embodiments, and any variations would be within the spirit and scope of the present invention. For example, the aspects may be able to be adapted for use in any tool where mapping one set of source elements to a second set of destination elements, based on a combination of spatial and logical relationships, is desired. Further, re-use of the single "isItBetter?" rule that analyzes the priority and success/failure of a given rule in determining whether one solution is better than another could be done by taking the rules and their analysis routines called by this "isItBetter" routine and replacing these with a set of rules specific to another application. Accordingly, many modifications may be made by one of ordinary skill in the art without departing from the spirit and scope of the appended claims.

What is claimed is:

1. A computer implemented method for optimized mapping of an integrated circuit package design, the method comprising:
   using at least one processor to perform a process, the process comprising:
   forming a preliminary assignment of nets based at least in part on a priority order, in which the preliminary assignment assigns a first circuit component from a source set of a net to a second circuit component of a destination set of the net;
   altering the preliminary assignment through introducing randomness in assigning the source set to the destination set of the net to refine the preliminary assignment;
   committing a final assignment from the action of refining as a final net assignment; and
   displaying the final net assignment on a display apparatus or storing the final net assignment on a non-transitory computer readable medium.

2. The computer implemented method of claim 1, the process further comprising automatically extracting a topological map representing an organization of a design layout.

3. The computer implemented method of claim 2, the process further comprising examining a design to determine an eligible set of destination pins for a given source pin based on a configured set of rules and weights for the design.

4. The computer implemented method of claim 3, the process further comprising identifying available routing channels for use in reaching a desired destination pin.

5. The computer implemented method of claim 2, the process further comprising comparing a base assignment and a proposed assignment based on a set of defined rules to determine whether the proposed assignment in more optimal than the base assignment.

6. The computer implemented method of claim 5, the process further comprising utilizing the topological map for efficient checking of the proposed assignment for rule violations.

7. A computer program product that includes a non-transitory computer readable medium, the non-transitory computer readable medium comprising a plurality of computer instructions which, when executed by a processor, cause the processor to execute a process for optimized mapping of an integrated circuit package design, the process comprising:
   forming a preliminary assignment of nets based at least in part on a priority order, in which the preliminary assignment assigns a first circuit component from a source set of a net to a second circuit component of a destination set of the net;
   altering the preliminary assignment through introducing randomness in assigning the source set to the destination set of the net to refine the preliminary assignment; and
   committing a final assignment from the act of refining as a final net assignment.

8. The computer program product of claim 7, the process further comprising automatically extracting a topological map representing an organization of a design layout.

9. The computer program product of claim 8, the process further comprising examining a design to determine an eligible set of destination pins for a given source pin based on a configured set of rules and weights for the design.

10. The computer program product of claim 9, the process further comprising identifying available routing channels for use in reaching a desired destination pin.

11. The computer program product of claim 8, the process further comprising comparing a base assignment and a proposed assignment based on a set of defined rules to determine whether the proposed assignment in more optimal than the base assignment.

12. The computer program product of claim 11, the process further comprising utilizing the topological map for efficient checking of the proposed assignment for rule violations.

13. A system for optimized mapping of an integrated circuit package design, the method comprising:
   a memory to hold program code instructions;
   at least one processor for executing the program code instructions, which when executed by the at least one processor, causes the at least one processor to
   form a preliminary assignment of nets based at least in part on a priority order, in which the preliminary assignment assigns a first circuit component from a source set of a net to a second circuit component of a destination set of the net
   alter the preliminary assignment through random perturbations introducing randomness in assigning the source set to the destination set of the net to refine the preliminary assignment, and
   commit a final assignment from the act of refining as a final net assignment.

14. The system of claim 13, the at least one processor is further to automatically extract a topological map representing an organization of a design layout.

15. The system of claim 14, the at least one processor is further to examine a design to determine an eligible set of destination pins for a given source pin based on a configured set of rules and weights for the design.

16. The system of claim 15, the at least one processor is further to identify available routing channels for use in reaching a desired destination pin.

17. The system of claim 14, the at least one processor is further to compare a base assignment and a proposed assignment based on a set of defined rules to determine whether the proposed assignment in more optimal than the base assignment.

18. The system of claim 17, the at least one processor is further to utilize the topological map for efficient checking of the proposed assignment for rule violations.

* * * * *